United States Patent
Cooper

(10) Patent No.: US 11,342,895 B2
(45) Date of Patent: May 24, 2022

(54) SYSTEMS AND METHODS FOR MODIFYING AN AUDIO PLAYBACK

(71) Applicant: Bose Corporation, Framingham, MA (US)

(72) Inventor: Jonathan Cooper, Newport, RI (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/594,811

(22) Filed: Oct. 7, 2019

(65) Prior Publication Data
US 2021/0104992 A1   Apr. 8, 2021

(51) Int. Cl.
| | | |
|---|---|---|
| *H03G 5/16* | (2006.01) | |
| *H04R 5/04* | (2006.01) | |
| *G06F 3/16* | (2006.01) | |
| *G10L 15/22* | (2006.01) | |

(52) U.S. Cl.
CPC ............ *H03G 5/165* (2013.01); *G06F 3/165* (2013.01); *G06F 3/167* (2013.01); *G10L 15/22* (2013.01); *H04R 5/04* (2013.01); *G10L 2015/223* (2013.01)

(58) Field of Classification Search
CPC ........... H03G 5/165; G06F 3/16; G06F 3/165; G06F 3/167; G10L 15/22; G10L 2015/223; G10L 1015/225; G10L 15/222; G10L 21/02; H04R 5/04

See application file for complete search history.

(56) References Cited

U.S. PATENT DOCUMENTS

| | | | | |
|---|---|---|---|---|
| 9,601,116 | B2 * | 3/2017 | Melendo Casado | .... G10L 15/20 |
| 2012/0027226 | A1 * | 2/2012 | Desenberg | .............. H04S 7/303 |
| | | | | 381/105 |
| 2013/0138434 | A1 * | 5/2013 | Furuta | ..................... G10L 21/02 |
| | | | | 704/226 |
| 2014/0277735 | A1 * | 9/2014 | Breazeal | ................ B25J 9/0003 |
| | | | | 700/259 |
| 2015/0302869 | A1 * | 10/2015 | Tomlin | .................... G10L 25/48 |
| | | | | 704/246 |
| 2017/0193978 | A1 * | 7/2017 | Goldman | ............. H04R 1/1041 |
| 2017/0236512 | A1 * | 8/2017 | Williams | ................ G06F 40/40 |
| | | | | 381/79 |
| 2020/0154236 | A1 * | 5/2020 | Carbune | ................ G06N 20/00 |

* cited by examiner

Primary Examiner — Kile O Blair
(74) Attorney, Agent, or Firm — Bond, Schoeneck & King, PLLC

(57) ABSTRACT

An audio system and method for modifying an audio playback including configuring an audio playback device, the audio playback device comprising a plurality of far-field audio inputs; generating the audio playback via the audio playback device; receiving, via at least one far-field audio input of the plurality of far-field audio inputs, a content-agnostic audio input from a first position within an environment; and, modifying the audio playback in response to the content-agnostic audio input.

20 Claims, 12 Drawing Sheets

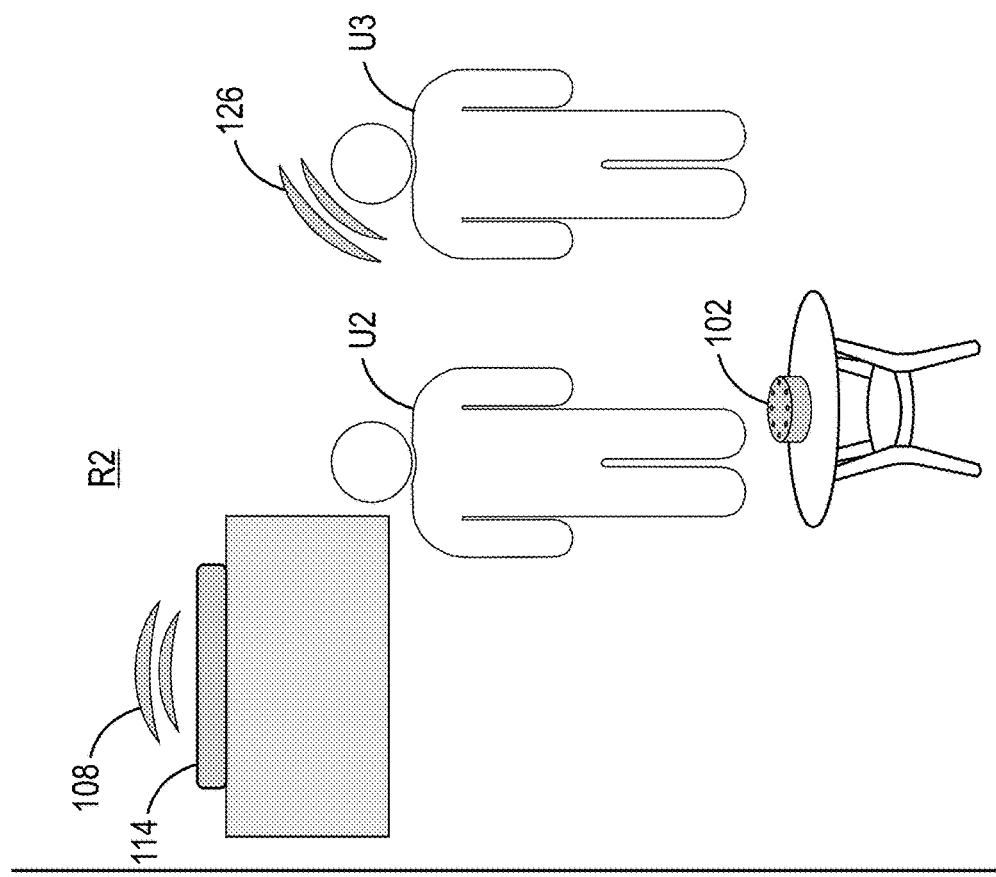
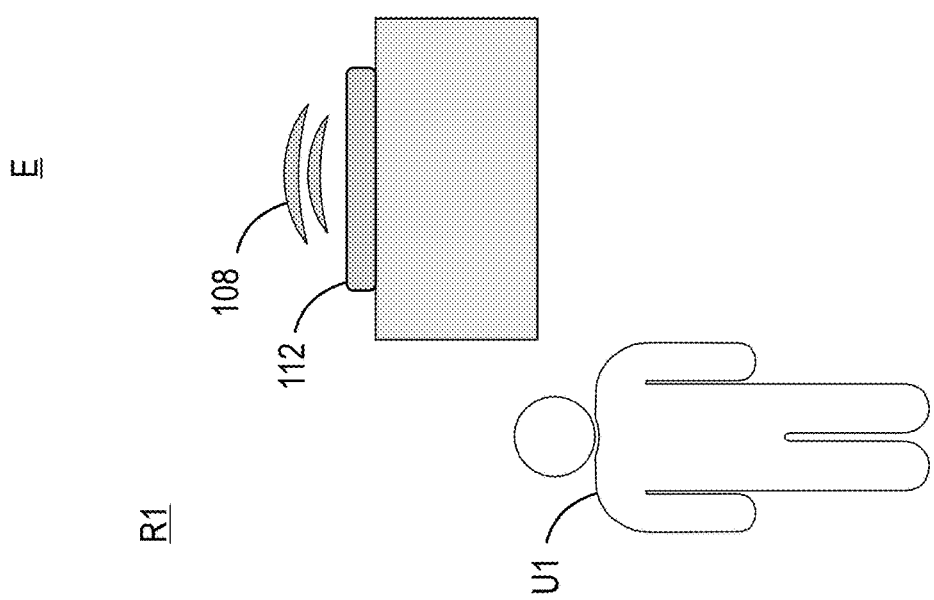
Fig. 7

SYSTEMS AND METHODS FOR MODIFYING AN AUDIO PLAYBACK

BACKGROUND

This disclosure generally relates to audio systems and methods, in particular, systems and methods for modifying or adjusting an audio playback.

Conventional audio playback devices often include microphone arrays capable of receiving audio inputs along with speakers capable of generating an audio output or playback. Such audio playback devices may be configured to perform various functions upon receiving a "wake word", i.e., a specific word or phrase spoken by a user to indicate when a command is intended. Without the use of the "wake word" the device remains inactive.

Home audio systems may be configured to work in conjunction with these audio playback devices to, for example, generate an audio playback corresponding to music, live stream audio, audio from a television set, or audio responses from a virtual private assistant. When the audio playback device recognizes the use of the wake word with, for example, speech recognition algorithms, the device typically pauses or eliminates any audio playback while the user speaks a command. However, during natural conversation, i.e., conversations not incorporating the required wake word, the audio playback remains unaffected and may hinder a conversation between users.

SUMMARY OF THE DISCLOSURE

The present disclosure is directed to improved systems and methods for modifying or adjusting an audio playback utilizing a content-agnostic audio input. The system and method may include an audio playback device having a plurality of far-field audio inputs arranged to receive a content-agnostic audio input and at least one audio output configured to generate an audio playback wherein the audio playback device is arranged to modify or adjust the audio playback generated by the at least one audio output based at least in part on the content-agnostic audio input. Modifying the audio playback may include adjusting an audio playback characteristic, for example, a volume characteristic, a bass characteristic, a treble characteristic, or equalization characteristic. Modifying the audio playback may also include sending the audio playback to an audio output device where the audio output device may be a wearable audio device, a speaker, or a portable speaker.

Generally, in one aspect, method for modifying an audio playback is provided, the method including: configuring an audio playback device, the audio playback device comprising a plurality of far-field audio inputs; generating the audio playback via the audio playback device; receiving, via at least one far-field audio input of the plurality of far-field audio inputs, a voice input from a first position within an environment; and, modifying the audio playback if the voice input exceeds a predefined content-agnostic threshold or matches a predefined content-agnostic pattern.

In one example, modifying the audio playback includes adjusting at least one audio playback characteristic of the audio playback.

In one example, the at least one audio playback characteristic is selected from: a volume characteristic, a bass characteristic, a treble characteristic, and an equalization characteristic.

In one example, the configuring of the audio playback device further includes: creating at least one user profile associated with a first user, the at least one user profile comprising a voice recognition profile associated with the first user.

In one example, modifying the audio playback includes sending the voice input to a first audio output.

In one example, the first audio output is a wearable audio device, a speaker, or a portable speaker.

In one example, generating the audio playback further includes: sending the audio playback to a first audio output at a second position, where the second position is located a first distance from the first position; and, sending the audio playback to a second audio output at a third position, where the third position is located a second distance from the first position; and, modifying the audio playback further includes: determining if the first distance is greater than the second distance, and modifying the audio playback to the first audio output if the first distance is not greater than the second distance, or modifying the audio playback to the second audio output if the first distance is greater than the second distance.

In one example, the predefined content-agnostic threshold is selected from: a volume threshold or a time threshold, and the predefined content-agnostic pattern is a conversational pattern.

In one example, the audio playback is modified if the voice input exceeds a predefined content-agnostic threshold and matches a predefined content-agnostic pattern.

In another aspect, a computer program product is provided, the computer program product stored on a computer readable medium which includes a set of non-transitory computer readable instructions for modifying an audio playback that when executed on a processor is arranged to: configure an audio playback device, the audio playback device comprising a plurality of far-field audio inputs; receive, via at least one far-field audio input of the plurality of far-field audio inputs, a voice input from a first position within an environment; and, modify the audio playback if the voice input exceeds a predefined content-agnostic threshold or matches a predefined content-agnostic pattern.

In an example, modifying the audio playback includes adjusting at least one audio playback characteristic of the audio playback.

In an example, the at least one audio playback characteristic is selected from: a volume characteristic, a bass characteristic, a treble characteristic, and an equalization characteristic.

In an example, the configuring of the audio playback device further includes: creating at least one user profile associated with a first user, the at least one user profile comprising a voice recognition profile associated with the first user.

In an example, modifying the audio playback includes sending the voice input to a first audio output.

In an example, the first audio output is a wearable audio device, a speaker, or a portable speaker.

In an example, generating the audio playback further includes: sending the audio playback to a first audio output at a second position, where the second position is located a first distance from the first position; and, sending the audio playback to a second audio output at a third position, where the third position is located a second distance from the first position; and, modifying the audio playback further includes: determining if the first distance is greater than the second distance; and, modifying the audio playback to the first audio output if the first distance is not greater than the second distance, or modifying the audio playback to the second audio output if the first distance is greater than the second distance.

In one example, generating the audio playback further includes sending the audio playback to a first audio output at a second position, where the second position is located a first distance from the first position; sending the audio playback to a second audio output at a third position, where the third position is located a second distance from the first position; modifying the audio playback at the first audio output and measuring a first voice input; modifying the audio playback to the second audio and measuring a second voice input; and modifying the audio playback to the first audio output or the second audio output based at least in part on the measured first voice input and/or the measured second voice input.

In an example, the predefined content-agnostic threshold is selected from: a volume threshold or a time threshold, and the predefined content-agnostic pattern is a conversational pattern.

In an aspect, an audio system for automatically modifying an audio playback is provided, the audio system including an audio playback device comprising a plurality of far-field audio inputs arranged to receive a voice input from a first position within an environment, and a first audio output arranged to receive audio playback data from the audio playback device corresponding with the audio playback, the first audio output further arranged to generate the audio playback wherein the audio playback device is arranged to automatically modify the audio playback if the voice input exceeds a predefined content-agnostic threshold or matches a predefined content-agnostic pattern.

In an example, automatically modifying the audio playback includes adjusting at least one audio playback characteristic of the audio playback wherein the audio playback characteristic is selected from: a volume characteristic, a bass characteristic, a treble characteristic, and an equalization characteristic.

These and other aspects of the various embodiments will be apparent from and elucidated with reference to the embodiment(s) described hereinafter.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various embodiments.

FIG. 7 is a schematic illustration of an audio system according to the present disclosure.

DETAILED DESCRIPTION

The present disclosure relates to improved systems and methods for modifying or adjusting an audio playback utilizing a content-agnostic audio input. The system and method may include an audio playback device having a plurality of far-field audio inputs arranged to receive a content-agnostic audio input and at least one audio output configured to generate an audio playback wherein the audio playback device is arranged to modify or adjust the audio playback generated by the at least one audio output based at least in part on the content-agnostic audio input. Modifying the audio playback may include adjusting an audio playback characteristic, for example, a volume characteristic, a bass characteristic, a treble characteristic, or equalization characteristic. Modifying the audio playback may also include sending the audio playback to an audio output device where the audio output device may be a wearable audio device, a speaker, or a portable speaker.

Figure 1:
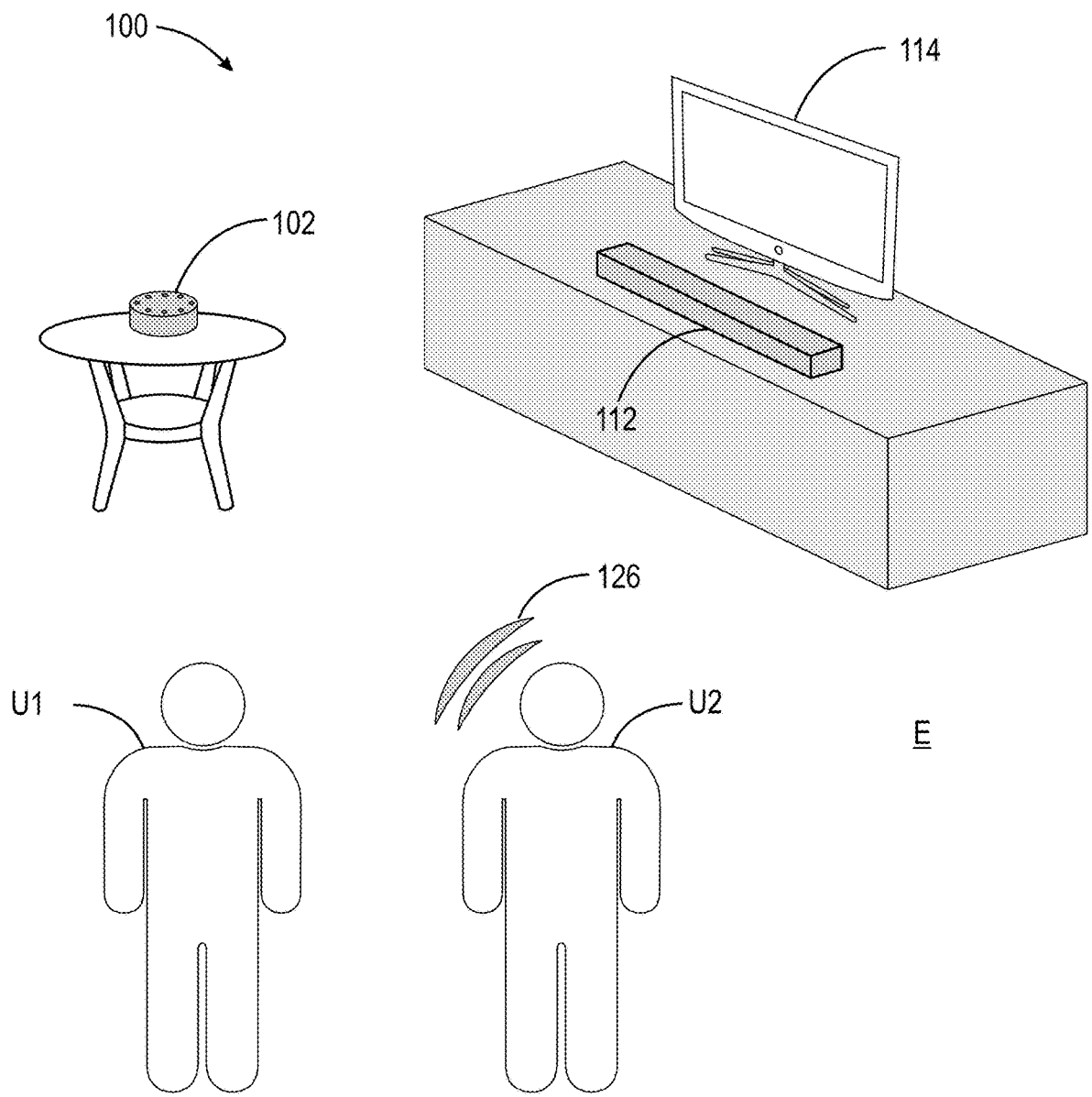
FIG. 1 is a schematic illustration of an audio system according to the present disclosure.
Figure 2:
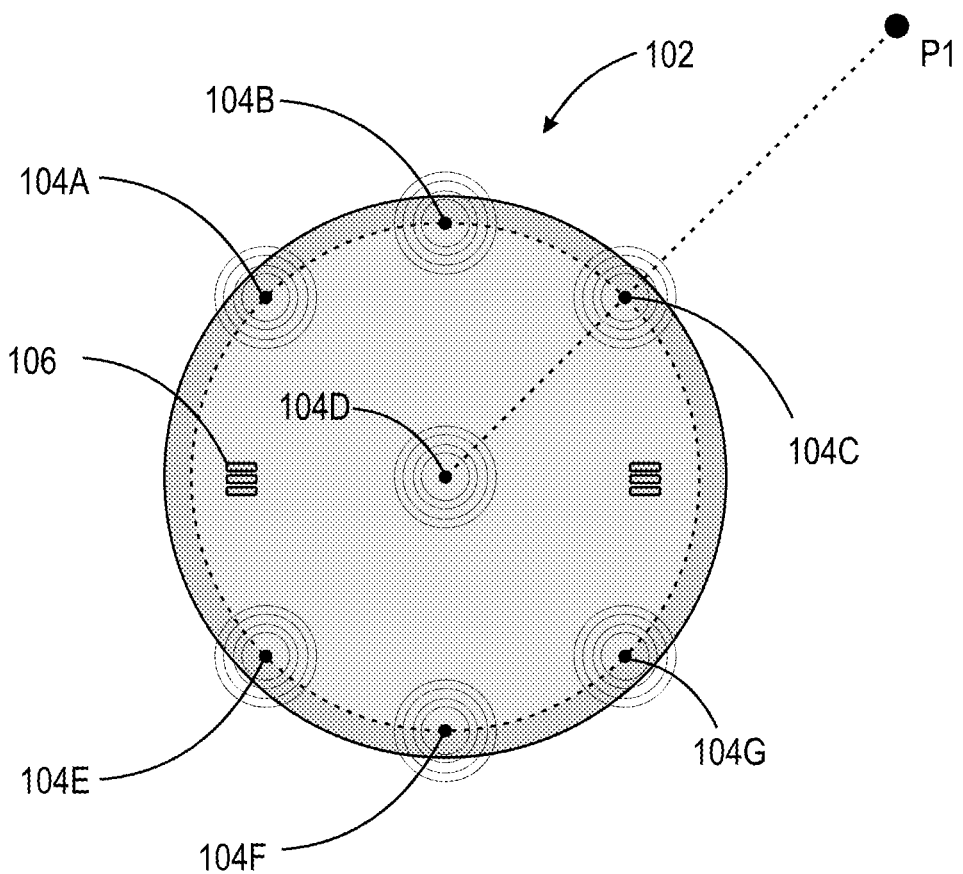
FIG. 2 is a top plan schematic view of an audio playback device according to the present disclosure.

Turning now to the figures, FIG. 1 is a schematic view of an audio system 100 according to the present disclosure. Audio system 100 may include an audio playback device 102. Although audio playback device 102 is illustrated throughout the present disclosure as a hub, smart hub, or smart device, for example, a smart speaker, it should be appreciated that any device capable of sending/receiving audio playback data 120 (discussed below) or receiving an audio input, for example, voice input 126 (discussed below) can be utilized. Audio playback device 102 may include a plurality of far-field audio inputs 104A-104G (shown in FIG. 2) arranged to receive an audio input from within an environment E. Each far-field audio input of plurality of far-field audio inputs 104A-104G (shown in FIG. 2) is intended to be a far-field microphone capable of receiving an audio input, for example, voice input 126 (discussed below) and converting the voice input into digital or analog electrical signals used in the various communications and functions of audio system 100 as discussed herein. Additionally, and although not illustrated for the sake of clarity, it should be appreciated that audio playback device 102 may include a first processor and first memory arranged to execute and store, respectively, a first set of non-transitory computer readable instructions to perform the functions of the audio playback device 102 as will be described herein. Furthermore, other electronic components may be included within audio playback device 102, for example, a first power source and a first communications interface. It should be appreciated that the first power source may be a device or component capable of holding a sufficient amount of electric charge such that it may power audio playback device 102 without the need for additional power, i.e., a battery, a capacitor, or a super capacitor; or, the power source may be configured to accept standard voltages from a wall outlet within a home or environment E (e.g., 120V-240V). The first communications interface may allow for a wired or wireless connection between, for example, audio playback device 102 and a wireless internet access point, or between audio playback device 102 and other peripheral devices, for example, first audio output 112 (discussed below) and second audio output 114 (discussed below).

The plurality of far-field audio inputs 104A-104G (shown in FIG. 2) of audio playback device 102 may be arranged in a pattern or configuration, for example, in a circular or oval pattern such that positional information related to an audio input within environment E may be obtained by audio playback device 102 (e.g., using a time-of-flight algorithm). For example, FIG. 2, which illustrates a top plan schematic view of audio playback device 102, shows that an audio input, i.e., a generated sound wave, may be initiated at first position P1. As sound in the form of an audio input propagates from first position P1 to audio playback device 102, the audio input may engage with or energize, for example, far-field audio input 104C and far-field audio input 104D. As first position P1 is positioned closer to far-field audio input 104C than far-field audio input 104D, far-field audio input 104C will be energized by the audio input before far-field audio input 104D indicating that the audio input was received in the direction of first position P1. In addition to determining the direction from which the audio input was received, audio playback device 102 may be capable of determining, based on the difference in time between the energization of these two far-field audio inputs 104C and 104D, respectively, the distance between audio playback device 102 and the position P1 within the environment E the source of the audio input was received from. In other words, after determining the general direction of the source of the audio input within environment E, audio playback device 102 may also be capable of determining the position P1 of the source of the audio input within environment E. As mentioned above, plurality of far-field audio inputs 104A-104G are arranged to receive voice input 126 (referenced below) from a user within environment E. Importantly, voice audio input 126 is intended to be any sound producible by human speech which does not require a specific content, i.e., is content-agnostic. In other words, contrary to previous systems that require the use of a specific wake word to activate further action by audio playback device 102, the plurality of far-field audio inputs 104A-104G of audio playback device 102 are arranged to receive any and all human speech above a predefined content-agnostic threshold, for example, predefined content agnostic threshold 128 (discussed below) or matches a predefined content-agnostic pattern 129 and process the voice input 126 for further use by audio playback device 102 as will be discussed below.

Additionally, other sound characteristics may be utilized to aid in determining the position of the source of the audio input, for example, amplitude or volume of the incoming audio signal measured at the plurality of far-field audio inputs 104A-104G. It should be appreciated that although audio playback device 102 is illustrated having plurality of far-field audio inputs 104A-104G arranged in a circular pattern, any shape or configuration can be utilized that would allow audio playback device 102 to determine the position or the source of the audio input within an environment E.

Audio playback device 102 may also include at least one audio playback output 106 arranged to generate sound, for example, audio playback 108. Audio playback output 106 is intended to be an integral speaker, i.e., arranged within the housing of audio playback device 102 and capable of generating and audio output, i.e., audio playback 108 (shown in FIG. 3). Audio playback 108 may be generated from music files, audiobook files, podcasts files, or other suitable audio entertainment file, which can be stored in memory of audio playback device 102, obtained over the internet from a cloud-based server connected to audio playback device 102, or stored on another external storage device in communication with audio playback device 102. Audio playback 108 may also be generated from audio data related to live streamed entertainment, for example, audio data related to live streamed television or radio, or may be generated by a virtual private assistant. Audio playback 108 may include a plurality of audio playback characteristics 110. Audio playback characteristics can be selected from at least one of: a volume characteristic, a bass characteristic, a treble characteristic, an equalization characteristic, or a frequency characteristic.

Figure 3:
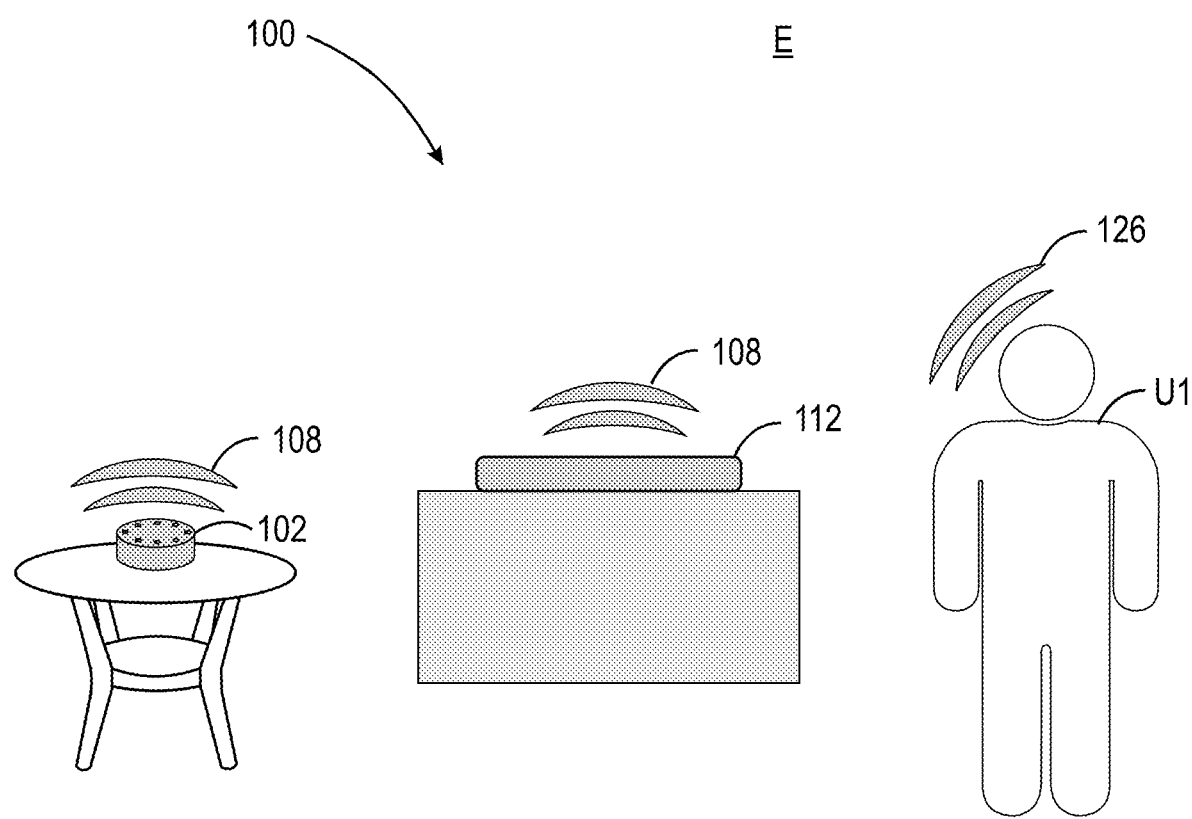
FIG. 3 is a schematic illustration of an audio system according to the present disclosure.
Figure 4:
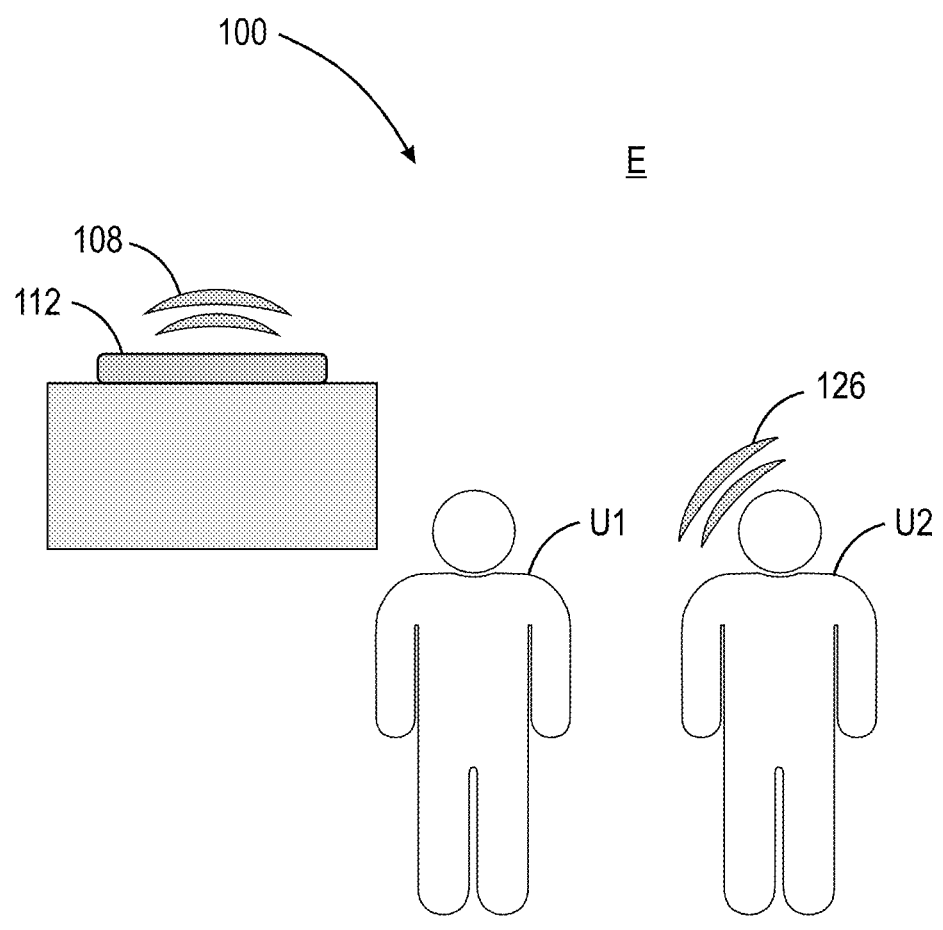
FIG. 4 is a schematic illustration of an audio system according to the present disclosure.
Figure 5:
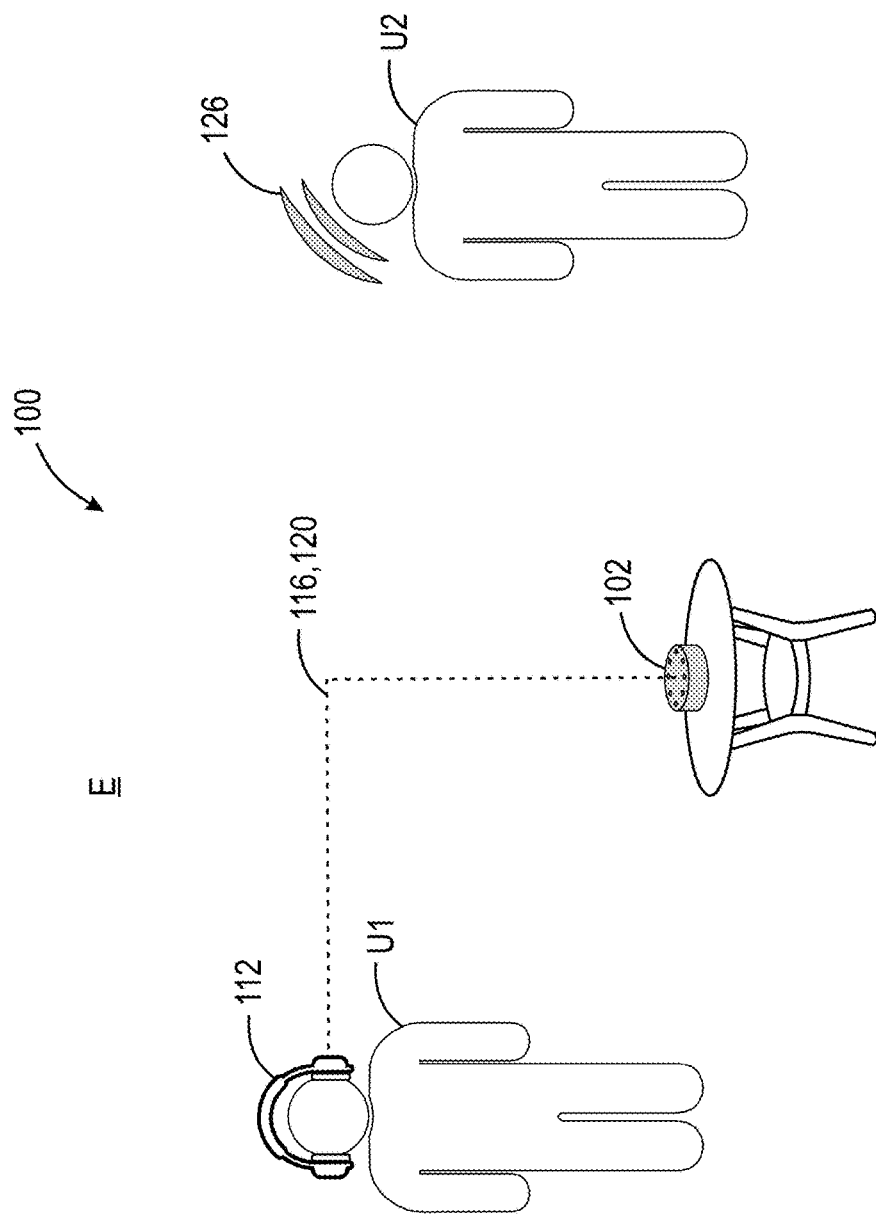
FIG. 5 is a schematic illustration of an audio system according to the present disclosure.

As illustrated in FIGS. 3-7, audio system 100 may include additional audio outputs, e.g., first audio output 112 and second audio output 114. First audio output 112 and second audio output 114 are intended to be discrete devices capable of generating audio, for example, audio playback 108. First audio output 112 and second audio output 114 can be selected from: a television with an attached speaker, a stand-alone speaker, a portable speaker, a sound bar, or a wearable audio device. The term "wearable audio device", as used in this application, is intended to mean a device that fits around, on, in, or near an ear (including open-ear audio devices worn on the head or shoulders of a user) and that radiates acoustic energy into or towards the ear. Wearable audio devices are sometimes referred to as headphones, earphones, earpieces, headsets, earbuds or sport headphones, and can be wired or wireless. A wearable audio device includes an acoustic driver to transduce audio signals to acoustic energy. The acoustic driver may be housed in an earcup. While some of the figures and descriptions following may show a single wearable audio device, having a pair of earcups (each including an acoustic driver) it should be appreciated that a wearable audio device may be a single stand-alone unit having only one earcup. Each earcup of the wearable audio device may be connected mechanically to another earcup or headphone, for example by a headband and/or by leads that conduct audio signals to an acoustic driver in the ear cup or headphone. A wearable audio device may include components for wirelessly receiving audio signals. A wearable audio device may include components of an active noise reduction (ANR) system. Wearable audio devices may also include other functionality such as a microphone so that they can function as a headset. While FIG. 5 shows an example of an around-ear form factor, in other examples the headset may be an in-ear, on-ear, near-ear headset or an eyeglass form factor. In some examples, a wearable audio device may be an open-ear device that includes an acoustic driver to radiate acoustic energy towards the ear while leaving the ear open to its environment and surroundings.

Each audio output, i.e., first audio output 112 and second audio output 114 may include a communications interface, i.e., a second communications interface and a third communications interface, respectively, arranged to exchange data, for example, audio playback data 120 discussed below for the generation of audio playback 108. First audio output 112 and second audio output 114 may be arranged to establish a wired or wireless connection with, for example, the first communications interface of audio playback device 102, such that a first connection 116 is established between first audio playback device 102 and first audio output 112, and a second connection 118 is established between audio playback device 102 and second audio output 114. It should also be appreciated that the communications interfaces of, for example, first audio output 112 and second audio output 114 may be arranged to establish the second connection 118 between the first audio output 112 and the second audio output 114, such that only one device needs to be connected to the audio playback device 102. It should be appreciated that first connection 116 and/or second connection 118 may utilize a wired or wireless protocol selected from: a Bluetooth protocol, a Bluetooth Low-Energy (BLE) protocol, a ZigBee protocol, Z-Wave protocol, 2G, 3G, 4G, 5G, a Wi-Fi (IEEE 802.11) protocol, or any other protocol for transferring data, e.g., audio data, within an environment. To that end, once first connection 116 and second connection 118 have been established between audio playback device 102, first audio output 112, and second audio output 114, audio playback device 102 is arranged to send audio playback data 120, i.e., wired or wireless data relating to audio playback 108, discussed above, to first audio output 112 and second audio output 114 such that they may receive audio playback data 120 and transduce the electrical signals received into tangible sound, i.e., into audio playback 108.

Audio playback device 102 may be further arranged to store a set of user profiles 122 associated with a plurality of users. The set of user profiles 122 may be stored within the first memory of audio playback device 102, within a server connected to first audio device 102 over the internet, or another external storage device connected to audio playback device 102. Each user profile 122 may contain voice recognition profiles 124A-124C (not shown) associated with, for example, a first user U1, a second user U2, and a third user U3, respectively. A voice recognition profile is intended to be a collection of data obtained through training and use of audio playback device 102 that allows audio playback device 102 when receiving a voice audio input, i.e., voice input 126 (discussed below), to determine which user is speaking to generate the audio. Voice recognition can include actual phonetic recognition of words using known natural language processing techniques, discrete speech recognition, continuous speech recognition or other known language processing techniques.

In a general example, audio system 100 and/or audio playback device 102 may be configured or preconfigured by a user, i.e., configured prior to use, such that audio playback device 102 follows a predetermined pattern of behavior based on the occurrence of certain conditions. Configuration may include establishing, creating, or otherwise generating user profiles 122 for each user that may routinely interact with audio playback device 102. Additionally, as mentioned above, this may involve training or repeated use of audio playback device 102 to give audio playback device 102 enough data relating to each user's particular voice signature such that each user may be determined by audio playback device 102 by the sound of their voice. Configuration may also include establishing a predefined set of rules or conditions that, when met, produce or trigger a predetermined result, i.e., establish a predefined content-agnostic threshold 128 or a predefined content-agnostic pattern 129. For example, each user profile 122 may specify during configuration a particular predefined content-agnostic threshold 128 or preconfigured content-agnostic pattern 129 to act as a trigger event for a given response. The predefined content-agnostic threshold 128 may be selected from a volume threshold or a time threshold while predefined content-agnostic pattern may be a conversational pattern. For example, a user may preconfigure audio system 100 and/or audio playback device 102 to trigger a particular condition based on the voice input 126 reaching a predetermined content-agnostic volume threshold, e.g., having a volume above a particular decibel level, for example, greater than 40, 45, 50, 55, 60, or 70 decibels. Additionally a predefined content-agnostic time threshold may be utilized, e.g., that voice input 126 includes a continuous or substantially continuous input over a predetermined length of time, for example, at least 5, 10, 15, 20, or 30 seconds. Furthermore, a predefined conversational pattern 129 may be utilized, e.g., a pattern that analyzes voice input 126 and determines whether voice input 126 includes inputs from one or more people, e.g., by detecting frequencies common to human speech (e.g., 80 hertz (Hz) to 8 kilohertz (kHz), or 300 Hz to 4 kHz) and/or audio patterns indicative of human speech (e.g., that indicate a person is speaking or multiple people are engaged in a conversation).

During configuration, the user may indicate that upon meeting one or more of these predefined content-agnostic thresholds 128 and/or matching the predefined content-agnostic pattern 129, an event should occur, i.e., a modification. A modification may be implemented on audio playback 108 and/or the various audio output devices discussed above. Modification may include adjusting an audio playback characteristic 110 (not shown) of audio playback 108 as discussed above, or it may include sending audio playback 108 to an audio playback output, i.e., first audio playback output 112 or second audio playback output 114 as will be discussed in the examples below. In other words, generally, audio system 100 is arranged to accept configuration parameters from at least one user to, at least in part, set a predefined content-agnostic threshold 128 or a predefined content-agnostic pattern 129 such that during use, i.e., while audio system 100 is generating audio playback 108, the plurality of far-field audio inputs 104A-104G are arranged to receive a voice input 126 from a user that sufficiently triggers the predefined content-agnostic threshold 128 or the predefined content-agnostic pattern 129 so that audio playback device 102 can modify audio playback 108 in conformance with the configured parameters established by the user during configuration.

In one example, illustrated in FIG. 3, during configuration, audio playback device 102 may include a user profile 124A (not shown) of the set of user profiles 122 for a first user U1. The first user U1 may specify a predefined content-agnostic threshold 128 (not shown) to act as a trigger event during operation of audio playback device 102. For example, first user U1 may specify the use of a predefined content-agnostic volume threshold, i.e., trigger a further operation of audio playback device 102 when plurality of far-field audio inputs 104A-104G of audio playback device 102 receive a voice input 126 that exceeds, for example, 50 decibels in volume. During operation of audio system 100, first user U1 may instruct audio system 100 to generate audio playback 108 from, for example, audio playback output 106 and/or first audio output 112. As established during configuration, should first user U1 produce a sound, i.e., a voice input 126 within environment E, audio system 100 and/or audio playback device 102 may be arranged to modify audio playback 108 by, for example, lowering the volume of audio playback 108. The foregoing example provides a system that can receive any audible user input, i.e., a content-agnostic voice input and modify the audio playback output of the system such that the content of the user's speech is not overshadowed, interfered with, or drowned out by the volume of the audio playback 108 within the environment E.

In another example, as illustrated in FIG. 4, more than one user may be present within environment E, i.e., first user U1 and second user U2. In this example, audio playback device 102 may be configured to operate with a predefined content-agnostic conversational pattern such that audio playback device 102 is capable of determining when a conversation is taking place between first user U1 and second user U2. The content-agnostic conversational pattern may utilize voice recognition profiles 124A (not shown) corresponding to first user U1 and voice recognition profile 124B (not shown) associated with second user U2, and may be arranged to trigger a response from the system, i.e., modify or alter audio playback 108 when it is determined that a conversation is occurring between first user U1 and second user U2. This may be determined, for example, by analyzing voice input 126 from both first user U1 and second user U2 and determining that both first user U1 and second user U2 have provided a voice input 126 within a predefined time frame, e.g., within a 1 minute time frame. As established during configuration, should audio playback device 102 determine that a conversation between first user U1 and second user U2 is occurring within environment E while audio playback 108 is being produced by, for example, first audio output 112, audio system 100 and/or audio playback device 102 may be arranged to modify audio playback 108 by, for example, lowering the volume of audio playback 108. The foregoing example, provides a system that can receive any audible user input from both first user U1 and second user U2, i.e., a content-agnostic voice input 126 and modify the audio playback 108 output of the system such that the content of the conversation between the first user U1 and the second user U2 is not overshadowed, interfered with, or drowned out by the volume of the audio playback 108 within the environment E. Although not illustrated, it should be appreciated that configuration using a predefined conversational pattern 129 may also include a determination of the identities of the users who are producing the voice inputs 126. In other words, audio playback device 102 may be arranged to distinguish which user or users are having the conversation and may only trigger a response if one or more designated users are a party to the conversation. For example, if first user U1 and second user U2 are adults, as evidenced by their voice recognition profiles, then audio system 100 may trigger a modification of audio playback 108 when a conversation between first user U1 and second user U2 is detected. However, if first user U1 is an adult and second user U2 is a child, or first user U1 and second user U2 are children, then audio system 100 may not trigger a modification of audio playback 108 when a conversation between first user U1 and second user U2 is detected.

In one example, as illustrated in FIG. 5, audio system 100 and/or audio playback device 102 may be arranged to port or forward the audio content of voice input 126 to first audio output 112 upon triggering the predefined content-agnostic threshold 128 or the predefined content-agnostic pattern 129. For example, audio system 100 may include audio playback device 102 and first audio output 112, where first audio output 112 is a wearable audio device taking the form of over-ear headphones with, for example, noise cancellation features or active noise reduction features (ANR). First audio output 112 may be arranged to receive audio playback data 120 directly from audio playback device 102 via first connection 116, and generate audio playback 108 within the over-ear headphones. In another implementation, first audio output may be arranged to receive audio playback data 120 indirectly from audio playback device 102 to generate audio playback 108 within the over-ear headphones, such as using an Internet-based or cloud connection. A second user, i.e., second user U2 may enter environment E and begin speaking, i.e., producing voice input 126. Voice input 126 is received by plurality of far-field audio inputs 104A-104G and is stored and processed as audio data to determine whether voice input 126 meets the predefined content-agnostic threshold 128 or the predefined content-agnostic pattern established during configuration of audio playback device 102. If audio system 100 and/or audio playback device 102 determines that the threshold or pattern has been met, audio system 100 and/or audio playback device 102 may send the audio data associated with voice input 126 directly to first audio output 112 in place of or in addition to audio playback 108 such that first user U1 may hear the voice input 126 through the speaker or speakers within first audio output 112. The foregoing example provides a system that can receive any audible user input from a user, e.g., second user U2, send/port/forward that audible user input to first audio output 112. Additionally, the foregoing example may modify the audio playback 108 output of the system such that the content of the voice input 126 generated by second user U2 can easily be distinguished by first user U1 within first audio output 112.

Figure 6:
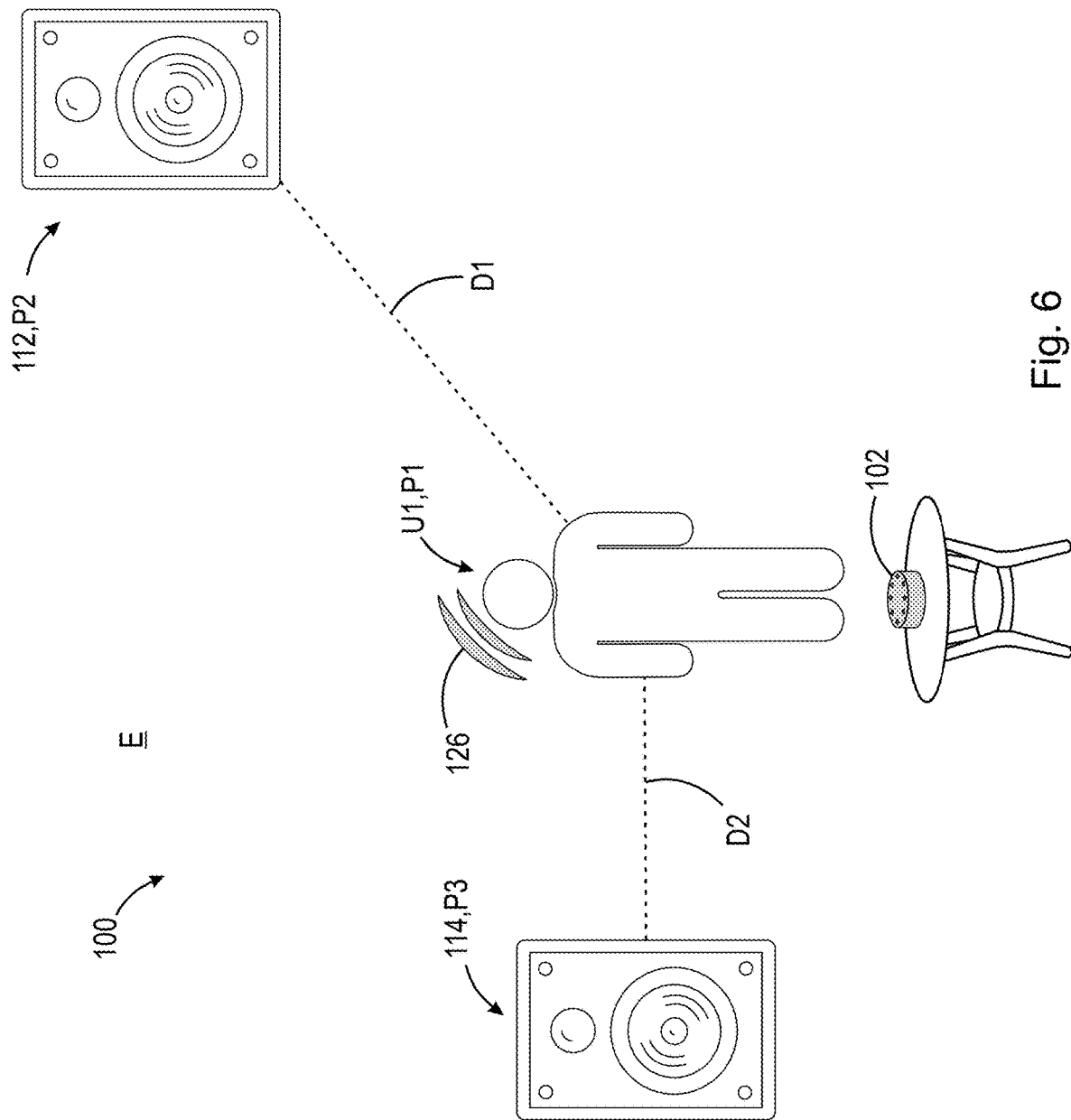
FIG. 6 is a schematic illustration of an audio system according to the present disclosure.

In one example, as illustrated in FIG. 6, audio system 100 may be configured to determine distance between each audio output connected to audio playback device 102 and modify the audio playback 108 produced by each audio output based on distance between the user or users that produced the voice input 126 and the audio outputs that produce audio playback 108. For example, audio system 100 may include audio playback device 102, a first user U1, a first audio output 112 and a second audio output 114. First user U1 may be located at a first position P1, first audio output 112 may be located at a second position P2, and second audio output 114 may be located at a third position P3 within environment E. the first position P1 may be located a first distance D1 from the second position P2, and the first position P1 may be located a second distance D2 from the third position P3 where first distance D1 is greater than second distance D2. Based on, for example, time-of flight calculations, as discussed above with respect to plurality of far-field audio inputs 104A-104G, audio playback device 102 may be capable of determining the position of the first user U1 when first user U1 produces voice input 126. Additionally, audio playback device 102 may be arranged to send audio playback data 120 to first audio output 112 at second position P2 and second audio output 114 at third position P3 so that first audio output 112 and second audio output 114 can produce audio playback 108. Audio playback device 102 may be able to determine, based on time of flight calculations, the positions of first audio output 112 and second audio output 114, i.e., second position P2 and third position P3, respectively. Once audio playback device 102 has determined the positions of first user U1 at first position P1, first audio output 112 at second position P2, and second audio output 114 at third position P3, the first distance D1 and second distance D2 can be calculated. Later, during operation of audio system 100 and/or audio playback device 102, upon receiving voice input 126 from first user U1, determining that the predefined content-agnostic threshold 128 or the predefined content-agnostic pattern has been met, and determining the positions of the first user U1, the first audio output 112, and the second audio output 114, audio playback device 102 may modify or adjust the audio playback 108 through, for example, second audio output 114 as second audio output 114 is located closer to first user U1. While audio playback device 102 can modify the audio playback 108 of second audio output 114, it should be appreciated that the audio playback 108 generated by first audio output 112 at second position P3 may remain unaffected.

The foregoing example may also be extended across multiple rooms within an environment E, as illustrated in FIG. 7. FIG. 7 illustrates a plurality of users may be present throughout multiple rooms within an environment E. For example, first user U1 may be located in a first room R1, and a second user U2 and third user U3 may be located in a second room R2. Within first room R1, there may be a first audio output 112 arranged to play audio playback 108 from audio playback data 120 sent and/or received from audio playback device 102 via first connection 116 (not illustrated), where first connection 116 may be direct (e.g., directly between 102 and 112) or indirect (e.g., using an Internet-based or cloud connection). Within second room R2 there may be a second audio output 114 arranged to play audio playback 108 from audio playback data 120 sent and/or received from audio playback device 102 via second connection 118 (not illustrated). During configuration, audio system 100 and/or audio playback device 102 is configured to operate using a predefined content-agnostic threshold 128 or predefined content-agnostic pattern 129, i.e., a volume threshold, a time threshold, or conversational pattern as discussed above. Upon receiving, via plurality of far-field audio inputs 104A-104G of audio playback device 102, a voice input 126 from, for example, third user U3, which is sufficient to trigger the predefined content-agnostic threshold 128 or predefined content-agnostic pattern 129, audio system 100 and/or audio playback device 102 may be arranged to modify or adjust audio playback 108. However, as audio playback 108 is generated in multiple rooms, i.e., in first room R1 and second room R2, audio system 100 and/or audio playback device 102 may be arranged to only modify or adjust the audio playback 108 within the room that voice input 126 was received by audio playback device 102. For example, a conversation may be taking place between second user U2 and third user U3 in second room R2. Audio system 100 and/or audio playback device 102 may be arranged to receive voice input 126 from second user U2 and third user U3 and determine a conversation is taking place in second room R2, i.e., that the conversation pattern has been met. Audio system 100 and/or audio playback device 102 may be further arranged to modify or adjust audio playback 108 within second room R2, e.g., lowering the volume of audio playback 108 so as to not interfere with the conversation between second user U2 and third user U3, while leaving the audio playback 108 generated by first audio output 112 within first room R1 unaffected (as no conversation is taking place in first room R1).

In one example, distance is not directly calculated or estimated. Instead, audio system 100 and/or audio playback device 102 is configured to sequentially modify the audio playback 108 through an audio output in each room, e.g., through first audio output 112, second audio output 114, or audio playback device 102, while sampling the user's voice input 126 and determine whether the user's sampled voice input 126 is affected more by modification to the audio playback 108 at one audio playback device or another positioned in different locations. For example, as illustrated in FIG. 6, the user can be positioned at a first position P1, first audio device 112 can be positioned in a second position P2, and second audio output 114 is positioned in a third position P3, where the distance between P1 and P2 is greater than the distance between P1 and P3. In this example, audio system 100 can temporarily alter or modify audio playback 108 emitted from, e.g., first audio output 112, and measure the user's voice input 126 at, e.g., audio playback device 102 to determine the effect that first audio input 112 has on the ability to hear the user's voice input. After the first voice input 126 is sampled, audio system 100 can then alter or modify the audio playback 108 emitted from second audio output 114 and measure a second voice input 126 from the user and determine the effect that second audio output 114 has on the user's voice. As a result, audio system 100 may then alter or modify the audio playback 108 as it is emitted from first audio output 112 or second audio output 114 based on, e.g., which audio output has a greater impact on the user's voice input 126 as measured during the respective modification of the first and second audio outputs. Thus, if the user's voice input 126 is effected to a greater degree by second audio output 114, as second audio output 114 is closer to the user, then audio system 100 can, for example, lower the volume or eliminated completely the audio playback 108 emitted from second audio output 114.

Figure 8:
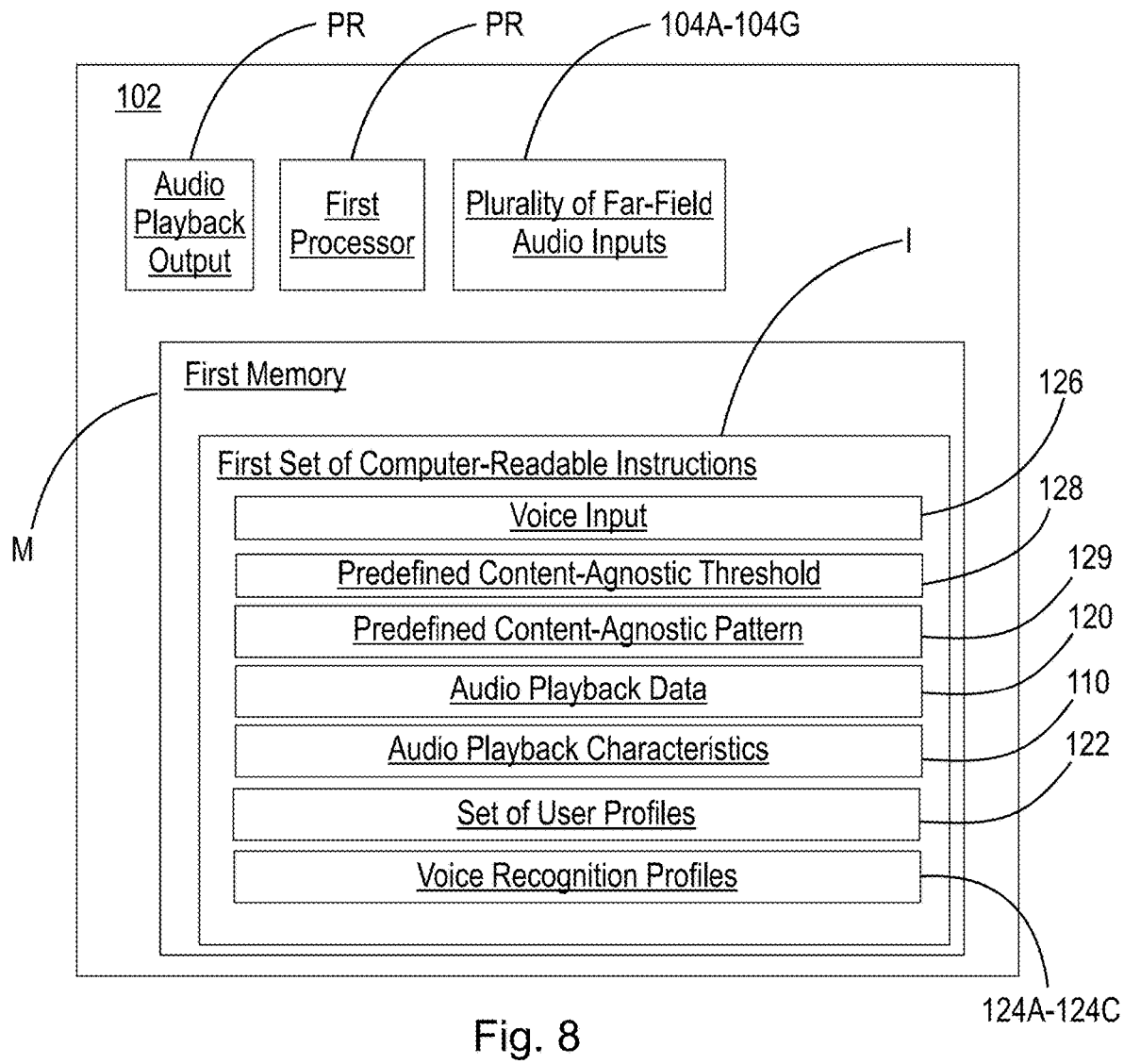
FIG. 8 is a schematic illustration of the internal components and information stored and processed by audio playback device 102 according to the present disclosure.

FIG. 8 illustrates a schematic representation of audio playback device 102 including the components and various forms of data and information stored within first memory M as discussed above.

Figure 9:
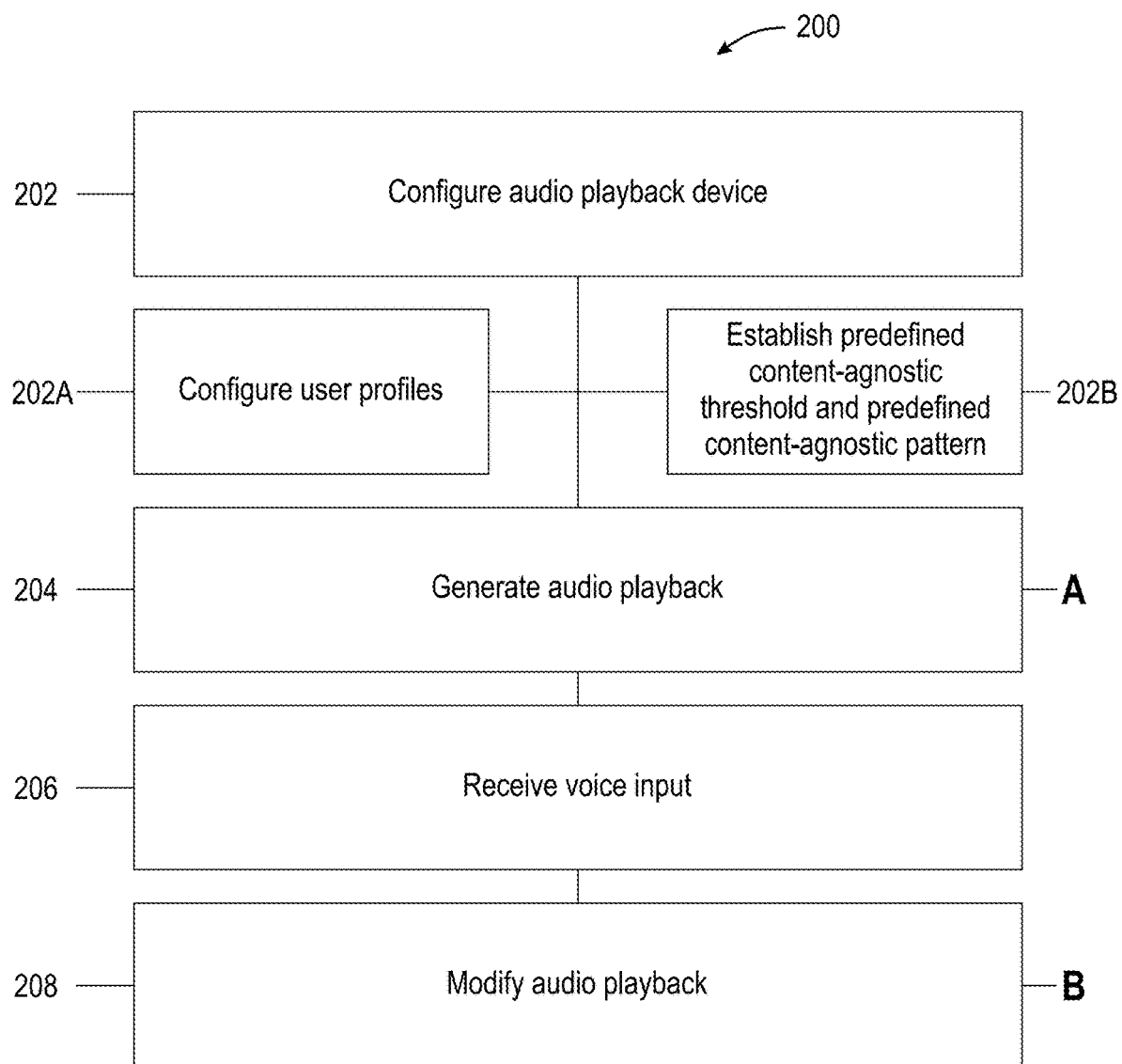
FIG. 9 is a flow chart illustrating the steps of a method according to the present disclosure.
Figure 10:
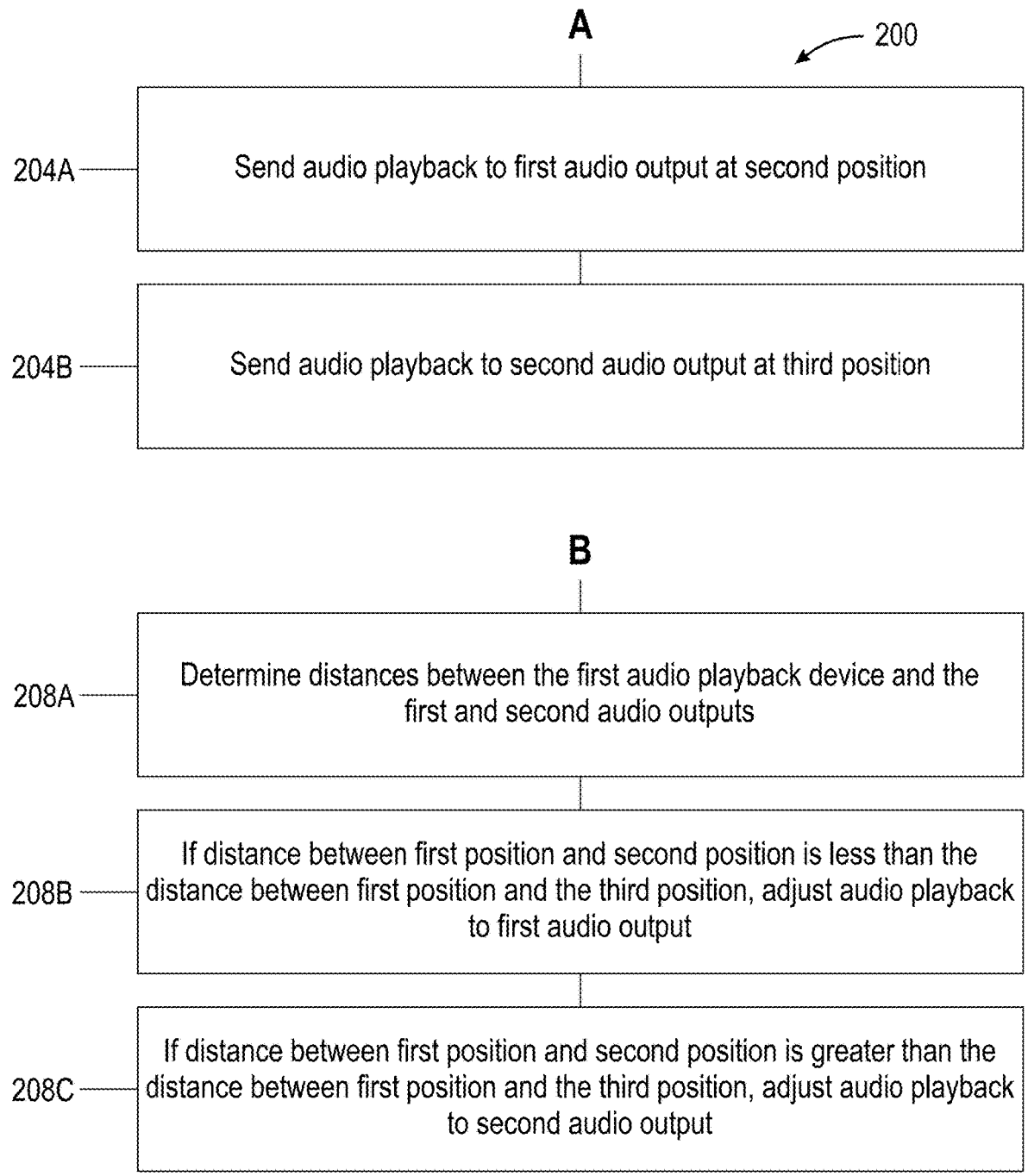
FIG. 10 is a continuation of the flow chart illustrated in FIG. 8 of the present disclosure.

FIGS. 9 and 10 illustrate a flow chart including the steps of method 200 according to the present disclosure. Method 200 may include, for example, configuring or preconfiguring audio playback device 102, the audio playback device 102 at a first position P1, the audio playback device 102 including a plurality of far-field audio inputs 104A-104G (step 202) which can include creating at least one user profile 122 associated with a first user U1, the at least one user profile 122 comprising a voice recognition profile 124A associated with the first user U1 (step 202A) and establishing a predefined content-agnostic threshold 128 or a predefined content-agnostic pattern 129 for a voice input 126 (step 202B); generating an audio playback 108 via the audio playback device 102 (step 204) which may include sending audio playback data 120 or audio playback 108 to a first audio output 112 at a second position P2 where the second position P2 is located a first distance D1 from the first position P1 (step 204A) and sending audio playback data 120 or audio playback 108 to a second audio output 114 at a third position P3 where the third position P3 is located a second distance D2 from the first position P1 (step 204B); receiving, via at least one far-field audio input 104D of the plurality of far-field audio inputs 104A-104G, the voice input 126 from a first position P1 within an environment E (step 206); and, modifying the audio playback 108 if the voice input 126 exceeds the predefined content-agnostic threshold 128 or matches the predefined content-agnostic pattern 129 (step 208) which may include the additional step of determining if the first distance D1 is greater than the second distance D2 (step 208A), adjusting the audio playback 108 to the first audio output 112 if the first distance D1 is less than the second distance D2 (step 208B); or adjusting the audio playback 108 to the second audio output 114 if the first distance D1 is greater than the second distance D2 (step 208C).

Figure 11:
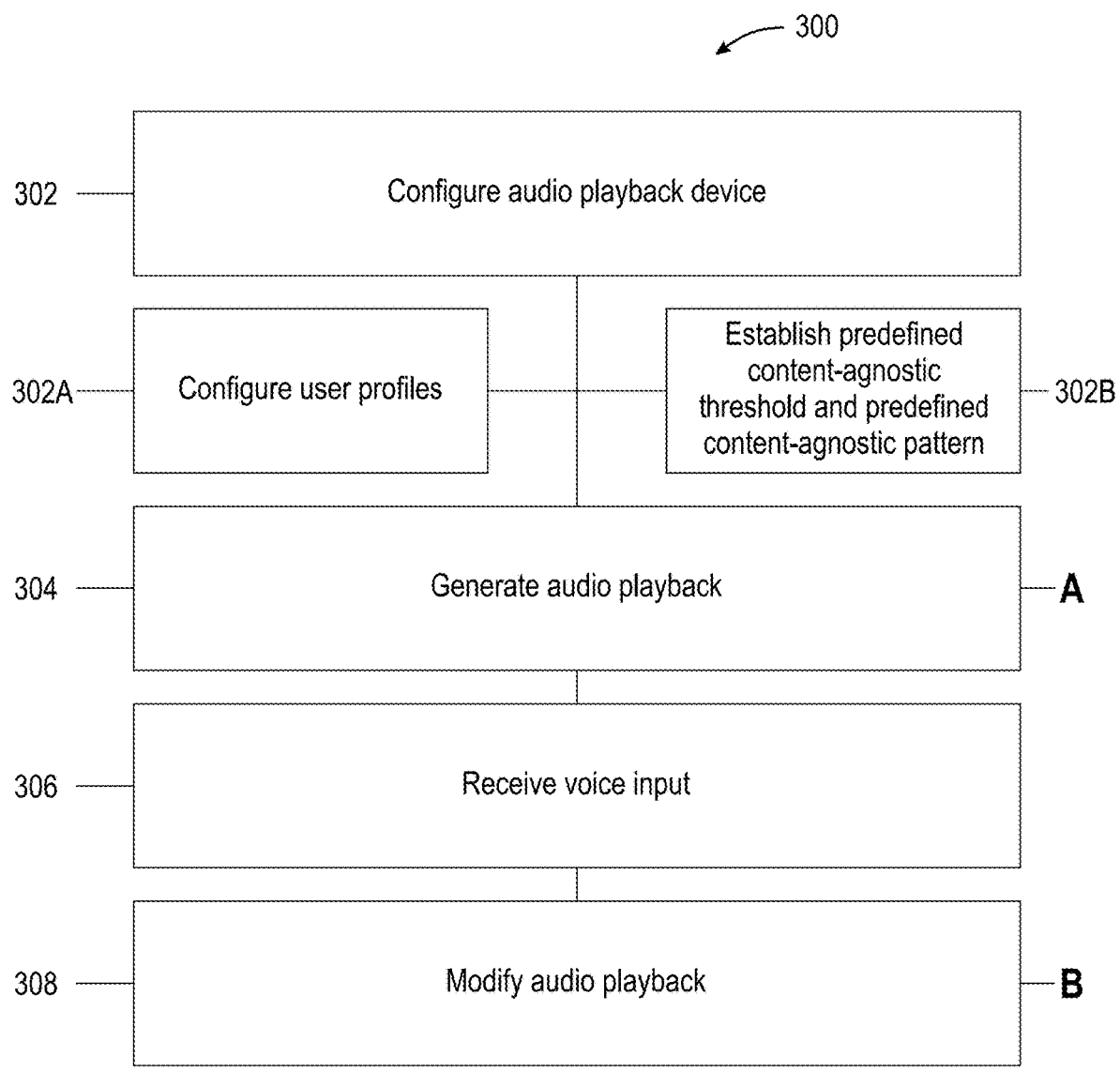
FIG. 11 is a flow chart illustrating the steps of a method according to the present disclosure.
Figure 12:
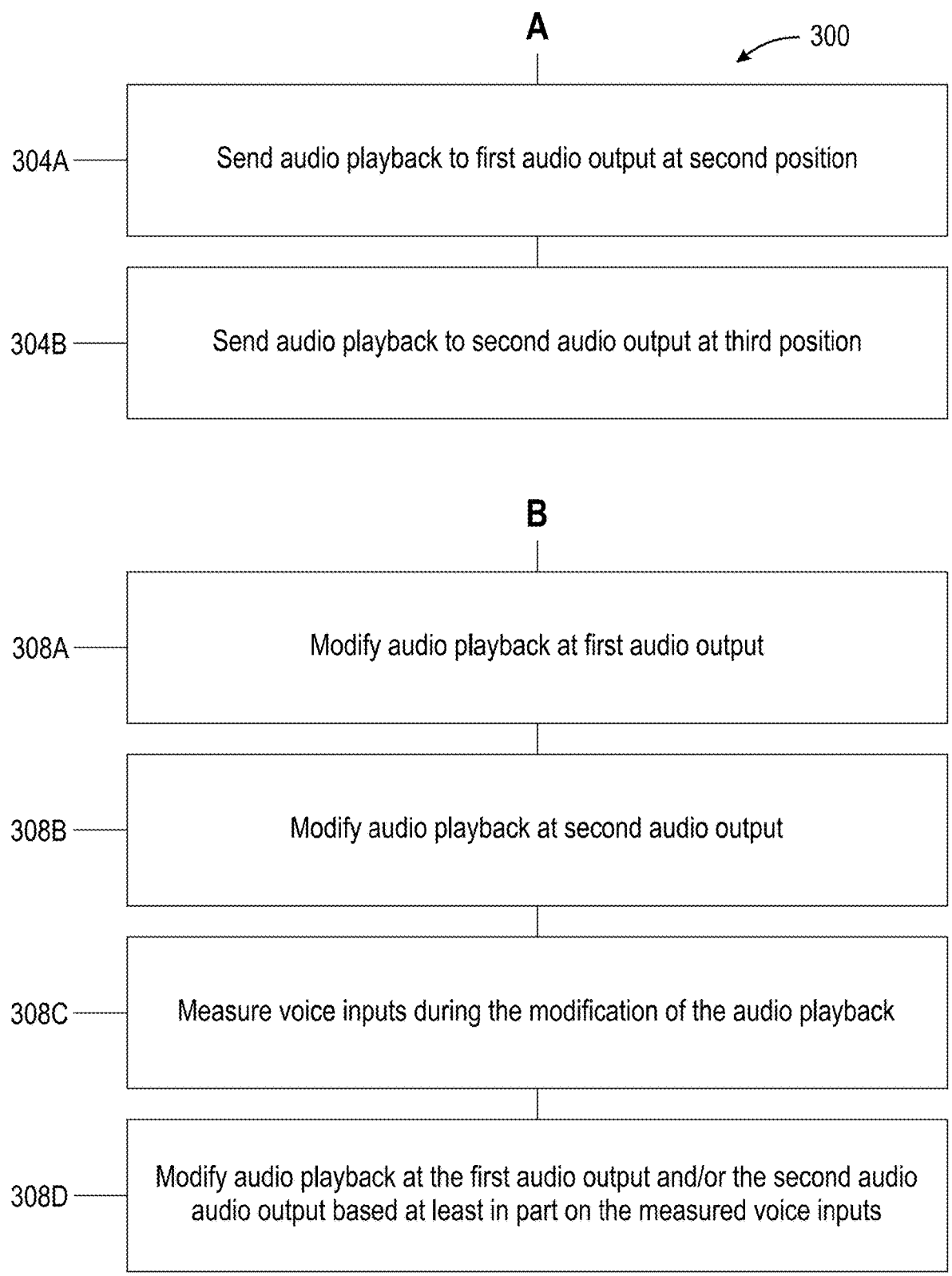
FIG. 12 is a continuation of the flow chart illustrated in FIG. 8 of the present disclosure.

FIGS. 11 and 12 illustrate a flow chart including the steps of method 300 according to the present disclosure. Method 300 may include, for example, configuring or preconfiguring audio playback device 102, the audio playback device 102 at a first position P1, the audio playback device 102 including a plurality of far-field audio inputs 104A-104G (step 302) which can include creating at least one user profile 122 associated with a first user U1, the at least one user profile 122 comprising a voice recognition profile 124A associated with the first user U1 (step 302A) and establishing a predefined content-agnostic threshold 128 or a predefined content-agnostic pattern 129 for a voice input 126 (step 302B); generating an audio playback 108 via the audio playback device 102 (step 204) which may include sending audio playback data 120 or audio playback 108 to a first audio output 112 at a second position P2 where the second position P2 is located a first distance D1 from the first position P1 (step 304A) and sending audio playback data 120 or audio playback 108 to a second audio output 114 at a third position P3 where the third position P3 is located a second distance D2 from the first position P1 (step 304B); receiving, via at least one far-field audio input 104D of the plurality of far-field audio inputs 104A-104G, the voice input 126 from a first position P1 within an environment E (step 306); and, modifying the audio playback 108 if the voice input 126 exceeds the predefined content-agnostic threshold 128 or matches the predefined content-agnostic pattern 129 (step 308) which may include the additional steps of modifying the audio playback 108 at the first audio output 112 (step 308A); modifying the audio playback 108 at the second audio output 114 (step 308B); measuring or sampling voice inputs 126 during the modification of the first audio output 112 or the modification of the second audio output 114 (step 308C); and modifying the audio playback 108 to the first audio output 112 and/or the second audio output 114 based at least in part on the measured voice inputs 126 measured during the modification of the first and second audio outputs (step 308D).

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects may be implemented using hardware, software or a combination thereof. When any aspect is implemented at least in part in software, the software code can be executed on any suitable processor or collection of processors, whether provided in a single device or computer or distributed among multiple devices/computers.

The present disclosure may be implemented as a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer readable program instructions.

The computer readable program instructions may be provided to a processor of a, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant may be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific examples described herein. It is, therefore, to be understood that the foregoing examples are presented by way of example only and that, within the scope of the appended claims and equivalents thereto, examples may be practiced otherwise than as specifically described and claimed. Examples of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A method for modifying an audio playback comprising:
configuring an audio playback device, the audio playback device comprising a plurality of far-field audio inputs, one or more audio playback outputs, and a housing, wherein the plurality of far-field audio inputs and the one or more audio playback outputs are arranged within the housing;
generating the audio playback via the audio playback device;
receiving, via at least one far-field audio input of the plurality of far-field audio inputs, a first voice input from a first user from a first position within an environment and a second voice input from a second user different from the first user; and,
modifying the audio playback if the first voice input and the second voice input exceed a predefined content-agnostic threshold or match a predefined content-agnostic pattern, wherein the predefined content-agnostic threshold and predefined content-agnostic pattern indicate a conversation between the first user and the second user.

2. The method of claim 1, wherein modifying the audio playback includes adjusting at least one audio playback characteristic of the audio playback.

3. The method of claim 2, wherein the at least one audio playback characteristic is selected from: a volume characteristic, a bass characteristic, a treble characteristic, and an equalization characteristic.

4. The method of claim 1, wherein the configuring of the audio playback device further comprises:
creating at least one user profile associated with a first user, the at least one user profile comprising a voice recognition profile associated with the first user.

5. The method of claim 1, wherein modifying the audio playback includes sending the voice input to a first audio output device.

6. The method of claim 5, wherein the first audio output device is a wearable audio device, a speaker, or a portable speaker.

7. The method of claim 1, wherein generating the audio playback further comprises:
sending the audio playback to a first audio output at a second position, where the second position is located a first distance from the first position; and,
sending the audio playback to a second audio output at a third position, where the third position is located a second distance from the first position; and,
wherein modifying the audio playback further comprises:
determining if the first distance is greater than the second distance using time-of-flight calculations; and,
modifying the audio playback to the first audio output if the first distance is not greater than the second distance; or,
modifying the audio playback to the second audio output if the first distance is greater than the second distance.

8. The method of claim 1, wherein generating the audio playback further comprises:
sending the audio playback to a first audio output at a second position over a first time period, where the second position is located a first distance from the first position;
sending the audio playback to a second audio output at a third position over a second time period after the first time period, where the third position is located a second distance from the first position;
modifying the audio playback at the first audio output while measuring a first voice input over the first time period;
modifying the audio playback to the second audio output while measuring a second voice input over the second time period; and
modifying the audio playback to the first audio output or the second audio output based at least in part on the measured first voice input and/or the measured second voice input.

9. The method of claim 1, wherein the predefined content-agnostic threshold is selected from: a volume threshold or a time threshold.

10. The method of claim 1, wherein the audio playback is modified if the voice input exceeds a predefined content-agnostic threshold and matches a predefined content-agnostic pattern.

11. A computer program product stored on a computer readable medium which includes a set of non-transitory computer readable instructions for modifying an audio playback that when executed on a processor is arranged to:
configure an audio playback device, the audio playback device comprising a plurality of far-field audio inputs, one or more audio playback outputs, and a housing, wherein the plurality of far-field audio inputs and the one or more audio playback outputs are arranged within the housing;
receive, via at least one far-field audio input of the plurality of far-field audio inputs, a first voice input from a first user from a first position within an environment, and a second voice input from a second user within the environment; and,
modify the audio playback if the first voice input and the second voice input exceed a predefined content-agnostic threshold or match a predefined content-agnostic pattern, wherein the predefined content-agnostic threshold and the predefined content-agnostic pattern indicate a conversation between the first user and the second user.

12. The computer program product of claim 11, wherein modifying the audio playback includes adjusting at least one audio playback characteristic of the audio playback.

13. The computer program product of claim 12, wherein the at least one audio playback characteristic is selected from: a volume characteristic, a bass characteristic, a treble characteristic, and an equalization characteristic.

14. The computer program product of claim 11, wherein the configuring of the audio playback device further comprises:
creating at least one user profile associated with a first user, the at least one user profile comprising a voice recognition profile associated with the first user.

15. The computer program product of claim 11, wherein modifying the audio playback includes sending the voice input to a first audio output device.

16. The computer program product of claim 15, wherein the first audio output device is a wearable audio device, a speaker, or a portable speaker.

17. The computer program product of claim 11, wherein generating the audio playback further comprises:
sending the audio playback to a first audio output at a second position, where the second position is located a first distance from the first position; and
sending the audio playback to a second audio output at a third position, where the third position is located a second distance from the first position; and,
wherein modifying the audio playback further comprises:
determining if the first distance is greater than the second distance using time-of-flight calculations; and,
modifying the audio playback to the first audio output if the first distance is not greater than the second distance; or,
modifying the audio playback to the second audio output if the first distance is greater than the second distance.

18. The computer program product of claim 11, wherein the predefined content-agnostic threshold is selected from: a volume threshold or a time threshold.

19. An audio system for automatically modifying an audio playback, the audio system comprising:
an audio playback device comprising a plurality of far-field audio inputs arranged to receive a first voice input from a first user from a first position within an environment and a second voice input from a second user within the environment, one or more audio playback outputs, and a housing, wherein the plurality of far-field audio inputs and the one or more audio playback outputs are arranged within the housing; and, a first audio output arranged to receive audio playback data from the audio playback device corresponding with the audio playback, the first audio output further arranged to generate the audio playback;

wherein the audio playback device is arranged to automatically modify the audio playback if the first voice input and the second voice input exceed a predefined content-agnostic threshold or match a predefined content-agnostic pattern, wherein the predefined content-agnostic threshold and the predefined content-agnostic pattern indicates a conversation between the first user and the second user.

20. The audio system of claim 19, wherein automatically modifying the audio playback includes adjusting at least one audio playback characteristic of the audio playback wherein the audio playback characteristic is selected from: a volume characteristic, a bass characteristic, a treble characteristic, and an equalization characteristic.

* * * * *